(12) United States Patent
Lee et al.

(10) Patent No.: US 9,385,208 B2
(45) Date of Patent: Jul. 5, 2016

(54) SEMICONDUCTOR DEVICE HAVING HIGH-K GATE DIELECTRIC LAYER

(71) Applicant: TAIWAN SEMICONDUCTOR MANUFACTURING COMPANY, LTD., Hsinchu (TW)

(72) Inventors: Kun-Yu Lee, Tainan (TW); Liang-Gi Yao, Shin Chu (TW); Yasutoshi Okuno, Hsinchu (TW); Clement Hsingjen Wann, Carmel, NY (US)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 0 days.

(21) Appl. No.: 14/665,612

(22) Filed: Mar. 23, 2015

(65) Prior Publication Data

US 2015/0200266 A1 Jul. 16, 2015

Related U.S. Application Data

(62) Division of application No. 13/213,344, filed on Aug. 19, 2011, now Pat. No. 8,987,095.

(51) Int. Cl.
*H01L 29/78* (2006.01)
*H01L 29/51* (2006.01)
*H01L 21/28* (2006.01)
*H01L 29/423* (2006.01)
*H01L 29/66* (2006.01)

(52) U.S. Cl.
CPC ........ *H01L 29/513* (2013.01); *H01L 21/28185* (2013.01); *H01L 21/28194* (2013.01); *H01L 29/42364* (2013.01); *H01L 29/517* (2013.01); *H01L 29/78* (2013.01); *H01L 29/66545* (2013.01); *H01L 29/7833* (2013.01)

(58) Field of Classification Search
CPC ... H01L 29/517; H01L 29/518; H01L 45/146; H01L 45/147; H01L 2251/303; H01L 21/022
USPC .......... 257/250, 310, 406, 410, 411; 438/261, 438/287, 591, 240
See application file for complete search history.

(56) References Cited

U.S. PATENT DOCUMENTS

2004/0106261 A1  6/2004  Huotari et al.
2005/0074978 A1  4/2005  Wang et al.
(Continued)

FOREIGN PATENT DOCUMENTS

CN   101203945   6/2008

OTHER PUBLICATIONS

Green, M. L., et al., "Nucleation and Growth of Atomic Layer Deposited HfO2 Gate Dielectric Layers on Chemical Oxide (Si—O—H) and Thermal Oxide (SiO2 or Si—O—N) Underlayers", Journal of Applied Physics, vol. 92, No. 12, Dec. 15, 2002, pp. 7168-7174.
(Continued)

*Primary Examiner* — Selim Ahmed
(74) *Attorney, Agent, or Firm* — Hauptman Ham, LLP

(57) ABSTRACT

A semiconductor device includes a substrate and a gate structure over the substrate. The gate structure includes a dielectric portion and an electrode portion that is disposed over the dielectric portion. The dielectric portion includes a carbon-doped high dielectric constant (high-k) dielectric layer over the substrate and a carbon-free high-k dielectric layer adjacent to the electrode portion.

19 Claims, 9 Drawing Sheets

(56) References Cited

U.S. PATENT DOCUMENTS

| | | |
|---|---|---|
| 2005/0233598 A1 | 10/2005 | Jung et al. |
| 2005/0269651 A1 | 12/2005 | Chen et al. |
| 2007/0036892 A1 | 2/2007 | Haukka et al. |
| 2007/0128736 A1* | 6/2007 | Chang ............... H01L 21/28079 438/3 |
| 2008/0057737 A1 | 3/2008 | Metzner et al. |
| 2008/0157181 A1 | 7/2008 | Kim et al. |
| 2011/0204380 A1* | 8/2011 | Yoshioka ............ H01L 29/0692 257/76 |
| 2011/0269267 A1 | 11/2011 | Fuchigami et al. |

OTHER PUBLICATIONS

Nyns, L, et al., "Silicon Orientation Effects in the Atomic Layer Deposition of Hafnium Oxide", Journal of The Electrochemical Society, 155 (2) G9-G12 (2008).

* cited by examiner

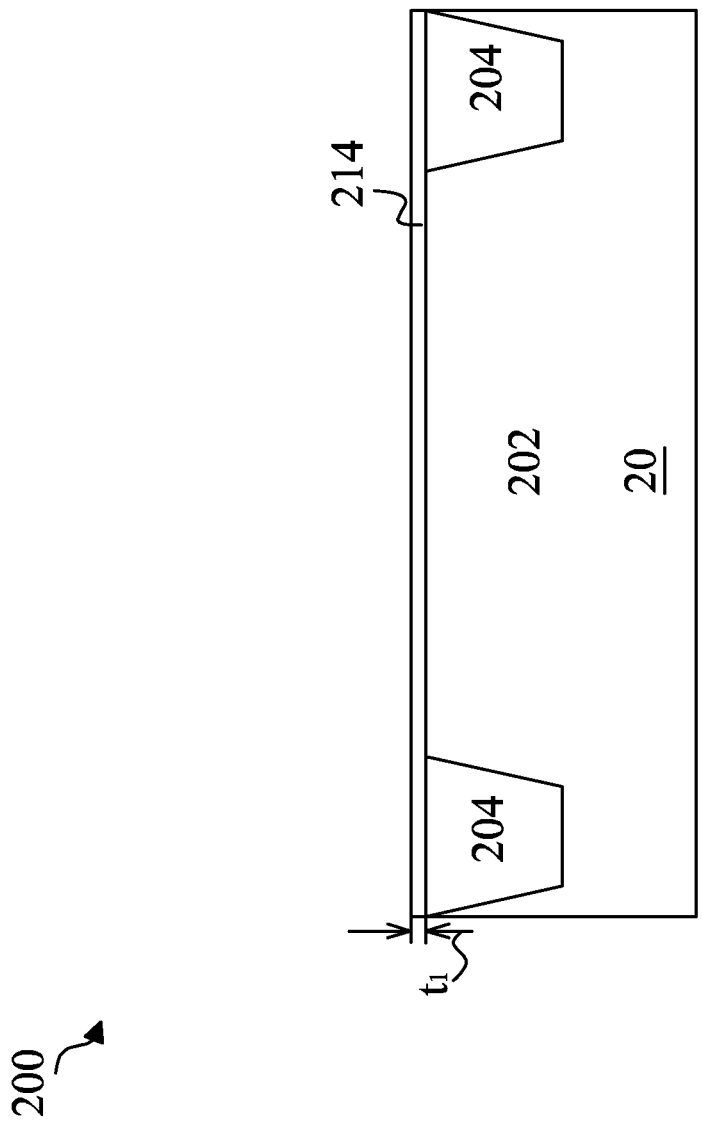

US 9,385,208 B2

SEMICONDUCTOR DEVICE HAVING HIGH-K GATE DIELECTRIC LAYER

PRIORITY CLAIM

The present application is a divisional of U.S. application Ser. No. 13/213,344, filed Aug. 19, 2011, which is incorporated herein by reference in its entirety.

FIELD

The disclosure relates to integrated circuit fabrication and, more particularly, to a semiconductor device with a high-k gate dielectric layer.

BACKGROUND

The semiconductor integrated circuit (IC) industry has experienced rapid growth. Technological advances in IC materials and design have produced generations of ICs where each generation has smaller and more complex circuits than the previous generation. As the dimensions of transistors decrease, the thickness of the gate dielectric layer must be reduced to maintain performance with the decreased gate length. However, in order to reduce gate leakage, high dielectric constant (high-k) gate dielectric layers are used which allow greater physical thicknesses while maintaining the same effective thickness. The gate dielectric layer further comprises an interfacial layer to reduce damage between the high-k gate dielectric layer and a silicon substrate.

However, there are challenges to implement such features and processes in complementary metal-oxide-semiconductor (CMOS) fabrication. As the gate length and spacing between devices decrease, these problems are exacerbated. For example, it is difficult to satisfy a threshold voltage requirement for a semiconductor device because the interfacial layer increases equivalent oxide thickness (EOT) of a gate stack, i.e., interfacial layer and high-k gate dielectric layer.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 2A-H are schematic cross-sectional views of a semiconductor device at various stages of fabrication according to various aspects of the present disclosure.

DESCRIPTION

Figure 1:
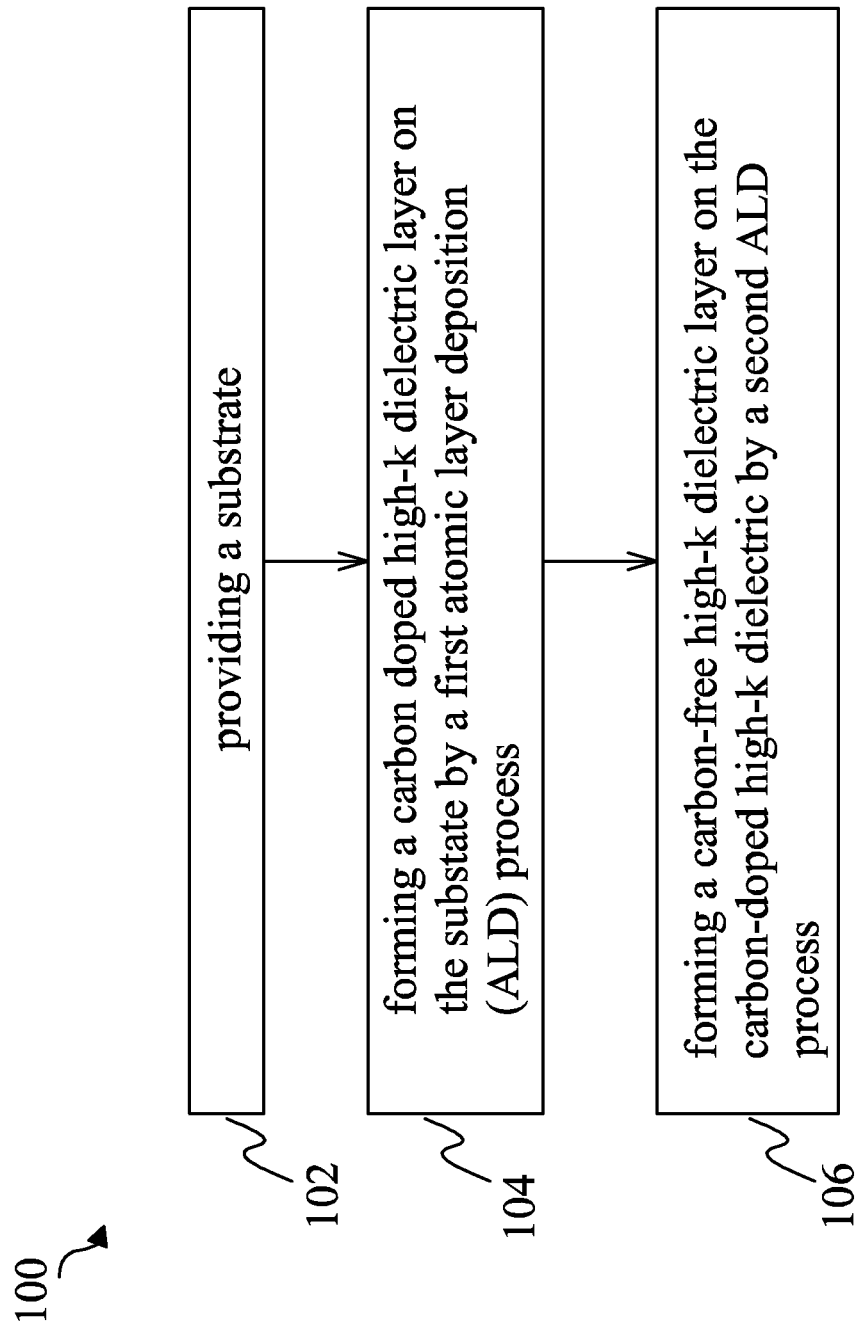
FIG. 1 is a flowchart of a method of fabricating a high-k gate dielectric layer according to various aspects of the present disclosure.

It is understood that the following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

FIG. 1 is a flowchart of a method 100 of fabricating a high dielectric constant (high-k) gate dielectric layer 212 (shown in FIG. 2C) according to various aspects of the present disclosure. FIGS. 2A-H are schematic cross-sectional views of a semiconductor device 200 (shown in FIGS. 2A-H) at various stages of fabrication according to various aspects of the present disclosure. It is understood that other parts of the semiconductor device 200 may be fabricated with normal complementary metal-oxide-semiconductor (CMOS) technology processes, and thus some example CMOS processes are briefly described herein. Also, FIGS. 1 through 2H are simplified for a better understanding of the present disclosure. For example, although the figures illustrate the high-k gate dielectric layer 212 for the semiconductor devices 200, it is understood the semiconductor device 200 may be part of an integrated circuit (IC) that may include a number of other devices including resistors, capacitors, inductors, and/or fuses, etc.

Figure 2A:
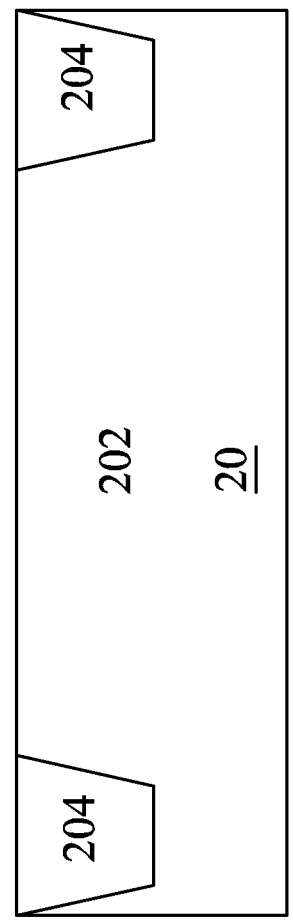

Referring to FIGS. 1 and 2A, the method 100 begins at step 102 wherein a substrate 20 having active regions 202 and isolation regions 204 is provided. In at least one embodiment, the substrate 20 comprises a crystalline silicon substrate (e.g., wafer). The substrate 20 may include various doping configurations depending on design requirements (e.g., p-type substrate or n-type substrate). In some embodiments, the substrate 20 is made of some other suitable elementary semiconductor, such as diamond or germanium; a suitable compound semiconductor, such as gallium arsenide, silicon carbide, indium arsenide, or indium phosphide; or a suitable alloy semiconductor, such as silicon germanium carbide, gallium arsenic phosphide, or gallium indium phosphide. Further, the substrate 20 may include an epitaxial layer (epi layer), may be strained for performance enhancement, and/or may include a silicon-on-insulator (SOI) structure.

The active regions 202 may include various doping configurations depending on design requirements. In some embodiments, the active regions 202 may be doped with p-type or n-type dopants. For example, the active regions 202 may be doped with p-type dopants, such as boron or $BF_2$; n-type dopants, such as phosphorus or arsenic; and/or combinations thereof. The active regions 202 may be configured for an N-type metal-oxide-semiconductor transistor device (referred to as an NMOS), or alternatively configured for a P-type metal-oxide-semiconductor transistor device (referred to as a PMOS).

The isolation regions 204 may be formed on the substrate 20 to isolate the active region 202 with other active regions (not shown) on the substrate 20. The isolation regions 204 may utilize isolation technology, such as local oxidation of silicon (LOCOS) or shallow trench isolation (STI), to define and electrically isolate the various active regions 202. In the present embodiment, the isolation region 204 includes a STI. The isolation regions 204 may comprise silicon oxide, silicon nitride, silicon oxynitride, fluoride-doped silicate glass (FSG), a low dielectric constant (low-K) dielectric material, other suitable materials, and/or combinations thereof. The isolation regions 204, and in the present embodiment, the STI, may be formed by any suitable process. As one example, the formation of the STI may include patterning the semiconductor substrate 20 by a conventional photolithography process, etching a trench in the substrate 20 (for example, by using a dry etching, wet etching, and/or plasma etching process), and filling the trench (for example, by using a chemical vapor deposition process) with a dielectric material. In some embodiments, the filled trench may have a multi-layer structure such as a thermal oxide liner layer filled with silicon nitride or silicon oxide.

In order to integrate high-k dielectric layers into current CMOS schemes, an interfacial layer composed of an oxide or oxynitride is formed between a substrate and a high-k dielectric layer. The function of the interfacial layer is to: (i) passivate dangling bonds at a surface of the substrate and form a high-quality interface with a low-density of defects; (ii) create a barrier against interfacial reactions and diffusion into the channel area of a semiconductor device; (iii) separate the high-k dielectric layer from the substrate surface in order to remove charge/traps in the high-k dielectric layer from the interface; and (iv) prevent diffusion of dopants and impurities through the high-k dielectric layer.

However, due to parasitic effect of series capacitance, the thickness of the interfacial layer should be minimal to achieve the required equivalent oxide thickness (EOT) of a gate stack, i.e., interfacial layer and high-k dielectric layer. It is difficult to achieve a predetermined EOT if the interfacial layer cannot be made thinner when the minimal feature size according to a particular manufacturing process becomes smaller.

Accordingly, the processing discussed below with reference to FIGS. 2B-2C may fabricate a high-k gate dielectric layer 212 having no interfacial layer. Problems associated with EOT increase from the interfacial layer may be avoided. Thus, Applicant's method may achieve the device performance characteristics, such as threshold voltage.

The method 100 in FIG. 1 continues with step 104 in which the structure in FIG. 2B is produced by forming a carbon-doped high-k dielectric layer 214 on the substrate 20 by a first atomic layer deposition (ALD) process. A high-k dielectric material is defined as a dielectric material with a dielectric constant greater than that of $SiO_2$. The carbon-doped high-k dielectric layer 214 comprises carbon-doped metal oxide. In some embodiments, the carbon-doped high-k dielectric layer 214 is selected from the group consisting of carbon-doped oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu and mixtures thereof. In at least one embodiment, the carbon-doped high-k dielectric layer 214 comprises carbon-doped hafnium oxide.

In the present embodiment, a pre-clean of the exposed surfaces of the intermediate semiconductor device 200 structure in FIG. 2A may be needed to remove a native oxide on a surface of the substrate 20 to create a hydrogen-terminated substrate 20 surface. This is accomplished via a diluted hydrofluoric acid (DHF) treatment or a vapor hydrofluoric acid (VHF) treatment for a suitable time.

Then, by providing alternating pulses of a metal (Me) precursor and an oxygen precursor to a reaction chamber, the first ALD process is performed to deposit the carbon-doped high-k dielectric layer 214 over the substrate 20. Each pulse of reactants saturates the surface in a self-limiting manner.

An exemplary first ALD process of forming the carbon-doped high-k dielectric layer 214 comprises the following steps. First, the semiconductor substrate 20 is loaded into a reaction chamber. Then, a pulse of a metal (Me) precursor is injected into the reaction chamber loaded with the semiconductor substrate 20 for a first period of time. Here, the metal (Me) precursor of the first ALD process comprises metal-organic compound. In at least one embodiment, the metal-organic compound comprises Li, Be, Mg, Ca, Sr, Sc, Y, Zr, Hf, Al, La, Ce, Pr, Nd, Sm, Eu, Gd, Tb, Dy, Ho, Er, Tm, Yb, or Lu. As depositing the carbon-doped hafnium oxide, the metal-organic compound comprises tetra-ethyl-methyl amino hafnium (TEMAHf).

As the metal (Me) precursor is injected into the reaction chamber, a chemi-sorption layer of the metal (Me) precursor is formed on top surface of the semiconductor substrate 20. Then, any residual metal (Me) precursor is discharged from the reaction chamber for a second period of time. To more effectively discharge the residual metal (Me) precursor from the reaction chamber, purge gas may be injected into the reaction chamber during this purging period, wherein the purge gas may include a substantially inert gas such as $N_2$, Ar, He, or similar inert gases.

After discharging the residual metal (Me) precursor from the reaction chamber, a pulse of an oxygen precursor is injected into the reaction chamber for a third period of time. Here, the oxygen precursor may be selected from the group consisting of $H_2O$, $D_2O$, $O_3$, $O_2$, and mixtures thereof. The $O_2$ and $O_3$ process parameters of concentration and pulse time are fine-tuned to avoid the bottom interfacial layer regrowth. The oxygen precursor reacts with the chemi-sorption layer of the metal (Me) precursor at a temperature of about 150° C. to 275° C. As a result, an atomic layer of the carbon-doped high-k dielectric layer 214 is formed on the semiconductor substrate 20. During ALD process, the reactor pressure is 0.1 torr to 10 torr. In the present embodiment, a carbon concentration of the carbon-doped high-k dielectric layer 214 is from about 0.3 to 3 atomic percent.

Then, any residual oxygen precursor is discharged from the reaction chamber for a fourth period of time. To more effectively discharge the residual oxygen precursor from the reaction chamber during this second purging period, a substantially inert gas such as $N_2$, Ar, He, or the like may be injected into the reaction chamber.

Normally, the first ALD process comprises a sequence of ALD cycles, i.e., the first through fourth time periods, as described above, during which each of the metal (Me) precursor and the oxygen precursor is alternately injected into and thereafter discharged from the reaction chamber, when taken together are regarded as one deposition or layer formation cycle. In the present embodiment, the first ALD process comprises over 10 cycles for forming carbon-doped hafnium oxide. By repeating this cycle multiple times, the carbon-doped high-k dielectric layer 214 with a desired thickness is thereby formed. In at least one embodiment, the carbon-doped high-k dielectric layer 214 has a thickness $t_1$ greater than 3.5 angstroms. In an alternative embodiment, the thickness $t_1$ of the carbon-doped high-k dielectric layer 214 is from about 3.5 angstroms to 10 angstroms.

Figure 2C:
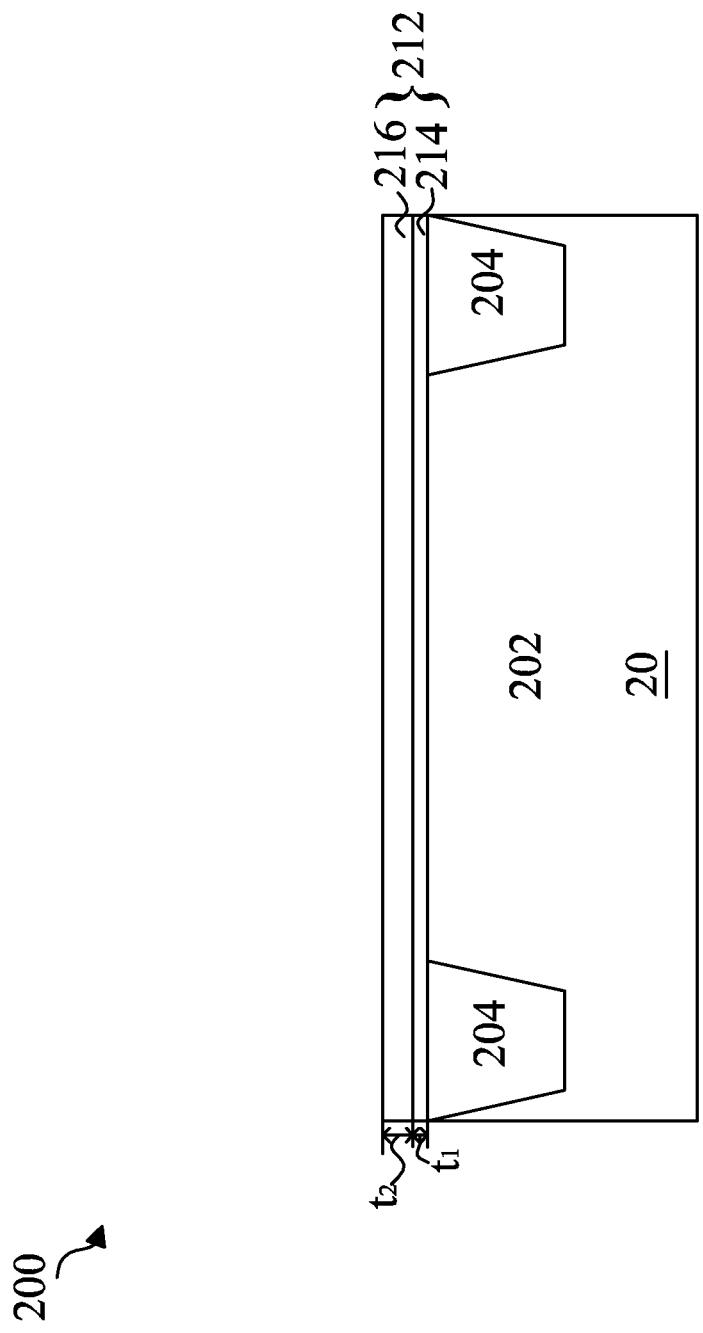

The method 100 in FIG. 1 continues with step 106 in which the structure in FIG. 2C is produced by forming a carbon-free high-k dielectric layer 216 on the carbon-doped high-k dielectric layer 214 by a second atomic layer deposition (ALD) process. A high-k dielectric material is defined as a dielectric material with a dielectric constant greater than that of $SiO_2$. The carbon-free high-k dielectric layer 216 comprises carbon-free metal oxide. In some embodiments, the carbon-free high-k dielectric layer 216 is selected from the group consisting of oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu and mixtures thereof. In at least one embodiment, the carbon-free high-k dielectric layer 216 comprises hafnium oxide. In the present embodiment, the carbon-doped high-k dielectric layer 214 and carbon-free high-k dielectric layer 216 are combined and referred to as the high-k gate dielectric layer 212.

An exemplary second ALD process of forming the carbon-free high-k dielectric layer 216 comprises the following steps. First, the semiconductor substrate 20 is loaded into a reaction chamber. Then, a pulse of a metal (Me) precursor is injected into the reaction chamber loaded with the semiconductor substrate 20 for a fifth period of time. Here, the metal (Me) precursor of the second ALD process comprises metal halide. In at least one embodiment, the metal halide comprises Li, Be, Mg, Ca, Sr, Sc, Y, Zr, Hf, Al, La, Ce, Pr, Nd, Sm, Eu, Gd, Tb, Dy, Ho, Er, Tm, Yb, or Lu. As depositing the hafnium oxide, the metal halide comprises $HfCl_4$.

As the metal (Me) precursor is injected into the reaction chamber, a chemi-sorption layer of the metal (Me) precursor is formed on top surface of the carbon-doped high-k dielectric layer 214. Then, any residual metal (Me) precursor is discharged from the reaction chamber for a sixth period of time. To more effectively discharge the residual metal (Me) precursor from the reaction chamber, purge gas may be injected into the reaction chamber during this purging period, wherein the purge gas may include a substantially inert gas such as $N_2$, Ar, He, or similar inert gases.

After discharging the residual metal (Me) precursor from the reaction chamber, a pulse of an oxygen precursor is injected into the reaction chamber for a seventh period of time. Here, the oxygen precursor may be selected from the group consisting of $H_2O$, $D_2O$, $O_3$, $O_2$, and mixtures thereof. The $O_2$ and $O_3$ process parameters of concentration and pulse time are fine-tuned to avoid the bottom interfacial layer regrowth. The oxygen precursor reacts with the chemi-sorption layer of the metal (Me) precursor at a temperature of about 250° C. to 325° C. As a result, an atomic layer of the carbon-free high-k dielectric layer 216 is formed on the semiconductor substrate 20.

Then, any residual oxygen precursor is discharged from the reaction chamber for an eighth period of time. To more effectively discharge the residual oxygen precursor from the reaction chamber during this purging period, a substantially inert gas such as $N_2$, Ar, He, or the like may be injected into the reaction chamber.

Normally, the second ALD process comprises a sequence of ALD cycles, i.e., the fifth through eighth time periods, as described above, during which each of the metal (Me) precursor and the oxygen precursor is alternately injected into and thereafter discharged from the reaction chamber, when taken together are regarded as one deposition or layer formation cycle. By repeating this cycle multiple times, the carbon-free high-k dielectric layer 216 with a desired thickness is thereby formed. In at least one embodiment, the carbon-free high-k dielectric layer 214 has a thickness $t_2$ greater than 10 angstroms. In alternative embodiment, the thickness $t_2$ of the carbon-free high-k dielectric layer 214 is from about 10 angstroms to 40 angstroms. In some embodiments, a ratio $(t_2/t_1)$ of the thickness $t_2$ of the carbon-free high-k dielectric layer 216 to the thickness $t_1$ of the carbon-doped high-k dielectric layer 214 is from about 1 to 10.

The process steps up to this point have provided the substrate 20 having the high-k gate dielectric layer 212 that is formed to maintain an EOT even when the manufacturing process evolved to a more compact technology. After the steps shown in FIGS. 2A-2C have been performed, then transistor fabrication may be completed using standard CMOS fabrication techniques. For example, FIGS. 2D-2H illustrate further processing performed to fabricate the semiconductor device 200 using a "gate last" CMOS process.

Figure 2D:
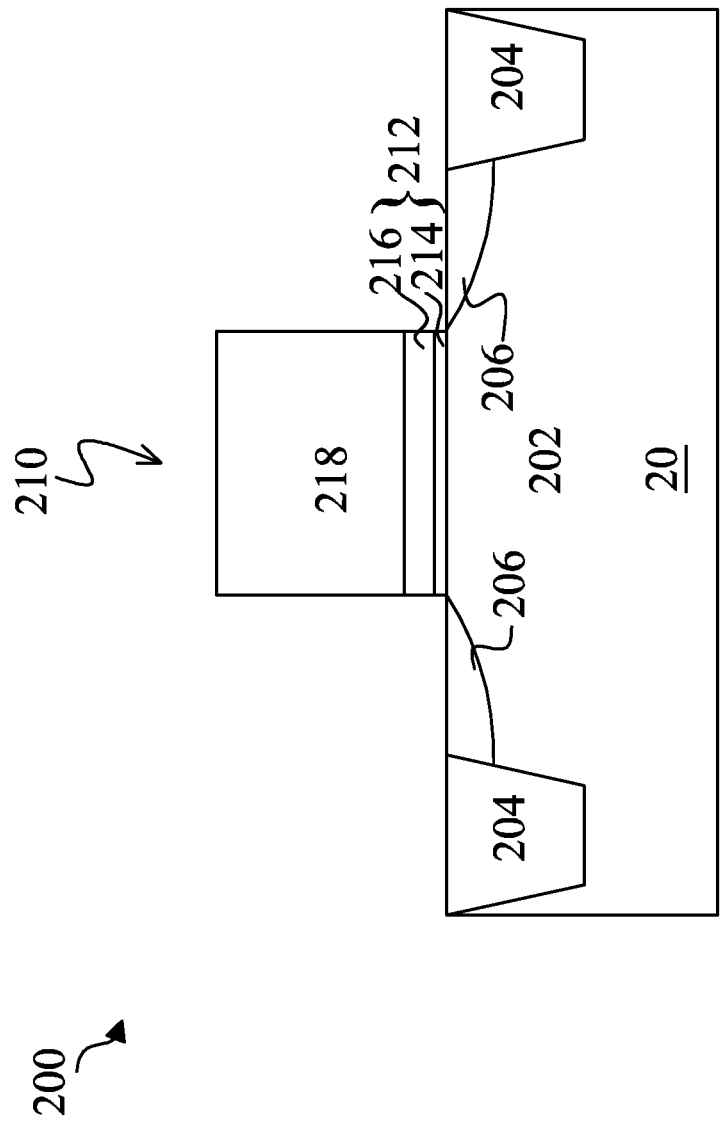

Referring now to FIG. 2D, a dummy gate electrode layer 218 may be formed over the high-k gate dielectric layer 212. In some embodiments, the dummy gate electrode layer 218 may comprise a single layer or multilayer structure. In the present embodiment, the dummy gate electrode layer 218 may comprise poly-silicon. Further, the dummy gate electrode layer 218 may be doped poly-silicon with the uniform or gradient doping. The dummy gate electrode layer 218 may have a thickness in the range of about 30 nm to about 60 nm. The dummy gate electrode layer 218 may be formed using a low-pressure chemical vapor deposition (LPCVD) process.

Then, a layer of photoresist (not shown) is formed over the dummy gate electrode layer 218 by a suitable process, such as spin-on coating, and patterned to form a patterned photoresist feature by a proper lithography patterning method. A width of the patterned photoresist feature is in the range of about 15 to 45 nm. The patterned photoresist feature can then be transferred using a dry etching process to the underlying layers (i.e., the high-k gate dielectric layer 212 and the dummy gate electrode layer 218) to form a dummy gate structure 210. The photoresist layer may be stripped thereafter.

Still referring to FIG. 2D, lightly doped source/drain (LDD) region 206 may be formed in the active region 202 of the substrate 20. The LDD regions 206 may be formed in the active region 202 by one or more ion implantation processes. The doping species may depend on the type of device being fabricated, such as an NMOS or PMOS device. For example, the LDD regions 206 may doped with p-type dopants, such as boron or $BF_2$; n-type dopants, such as phosphorus or arsenic; and/or combinations thereof. The LDD regions 206 may comprise various doping profiles. The LDD regions 206 may be aligned with an outer edge of the dummy gate structure 210 following the ion implantation process.

Figure 2E:
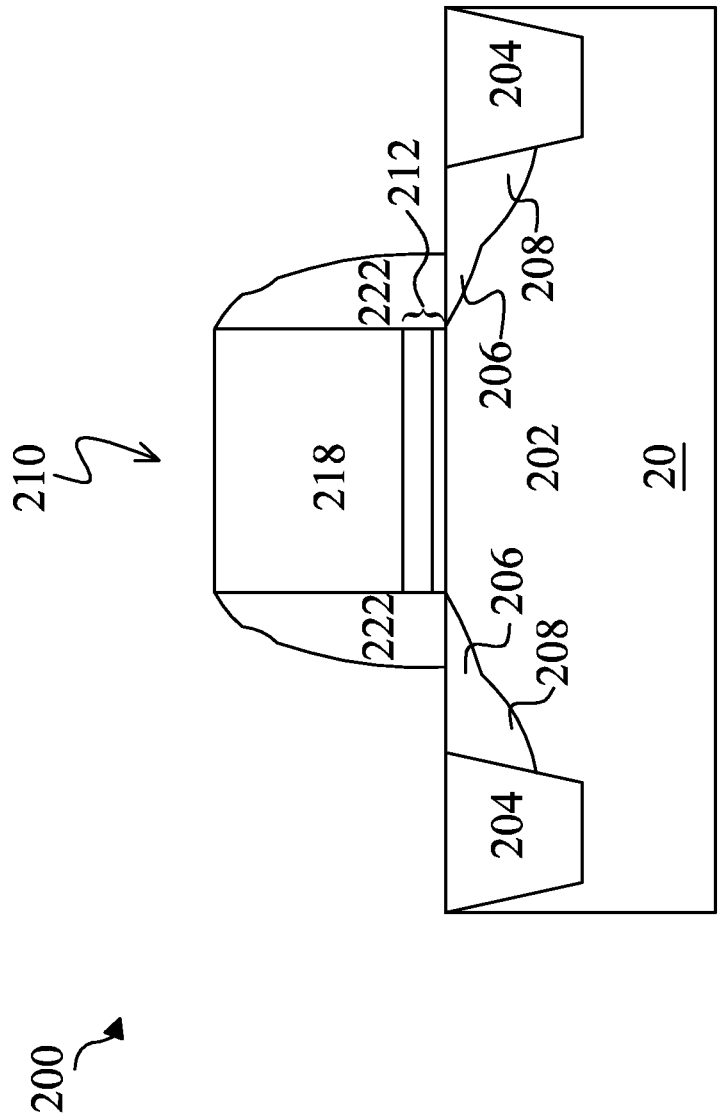

Referring to FIG. 2E, a dielectric layer, such as silicon nitride or silicon oxynitride, is formed to surround the dummy gate structure 210. The dielectric layer may be formed by plasma deposition at a temperature less than 400° C. and at a pressure of about 200 mTorr to 1 Torr, using $SiH_4$, $NH_3$ and/or $N_2O$ as reaction gases. Then, an anisotropic etching is performed on the dielectric layer to form a pair of gate spacers 222 on two sides of the dummy gate structure 210. The pair of gate spacers 222 comprises a thickness in the range of about 7 nm to about 15 nm. The pair of gate spacers 222 may comprise a multilayer structure.

Still referring to FIG. 2E, the pair of gate spacers 222 may be used to offset source/drain (S/D) regions 208. The S/D regions 208 may be formed in the active region 202 of the substrate 20 by one or more ion implantation processes. The doping species may depend on the type of device being fabricated, such as an NMOS or PMOS device. For example, the S/D regions 208 may doped with p-type dopants, such as boron or $BF_2$; n-type dopants, such as phosphorus or arsenic; and/or combinations thereof. The S/D regions 208 may comprise various doping profiles, and the S/D regions 208 may be aligned with an outer edge of the spacers 222 following the ion implantation process. The S/D regions 222 may further include raised S/D regions in some embodiments. Also, one or more contact features (e.g., silicide regions) may be formed on the S/D regions 222 by a self-aligned silicidation process.

Figure 2F:
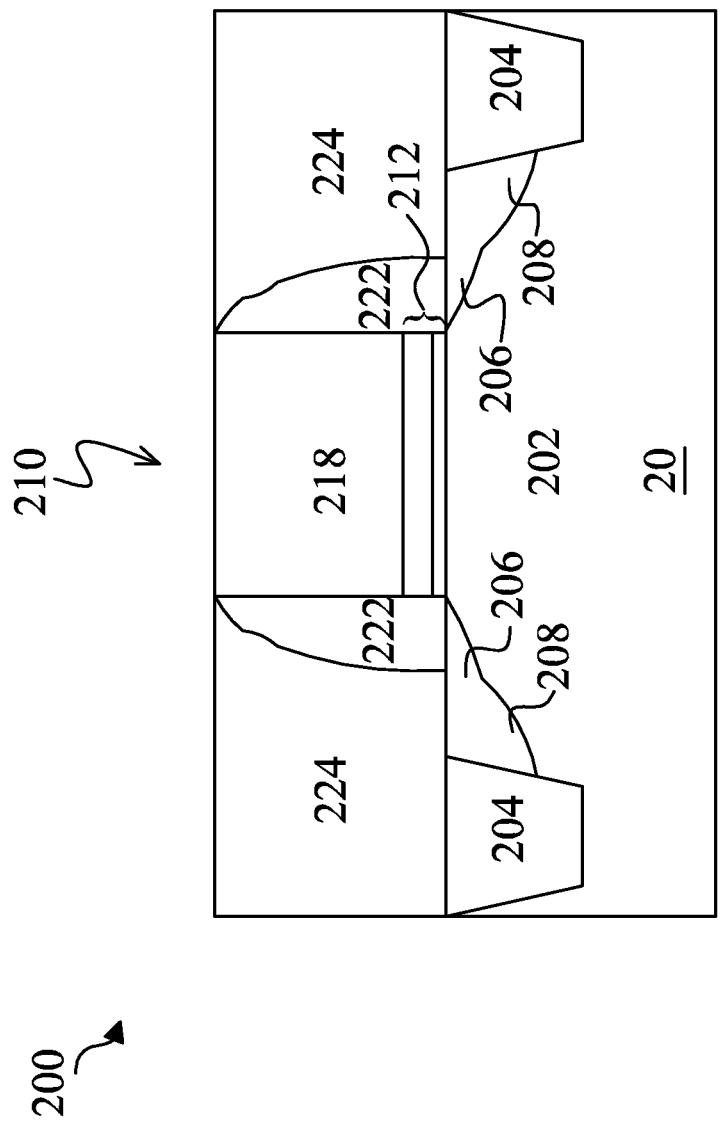

Referring to FIG. 2F, an inter-layer dielectric (ILD) layer 224 may be formed over the substrate 20, including over the dummy gate structure 210. The ILD layer 224 may comprise a dielectric material. The dielectric material may comprise silicon oxide, spin-on glass (SOG), fluorinated silica glass (FSG), carbon doped silicon oxide (e.g., SiCOH), BLACK DIAMOND® (Applied Materials of Santa Clara, Calif.), other suitable dielectric materials, and/or combinations thereof. In some embodiments, the ILD layer 224 may include a high density plasma (HDP) dielectric material and/ or a high aspect ratio process (HARP) dielectric material. In the present embodiment, the ILD layer 224 comprises a thickness in the range of about 4000 Å to about 8000 Å. It is understood that the ILD layer 224 may comprise one or more dielectric materials and/or one or more dielectric layers.

Subsequently, the ILD layer 224 may be planarized by a chemical-mechanical-polishing (CMP) process until a top portion of the dummy gate structure 210 is exposed. The CMP process may have a high selectivity to provide a substantially planar surface for the dummy gate structure 210, the pair of gate spacers 222, and ILD layer 224. In the present embodiment, the dummy gate structure 210 may be surrounded with dielectric comprising the pair of gate spacers 222 and ILD layer 224.

Figure 2G:
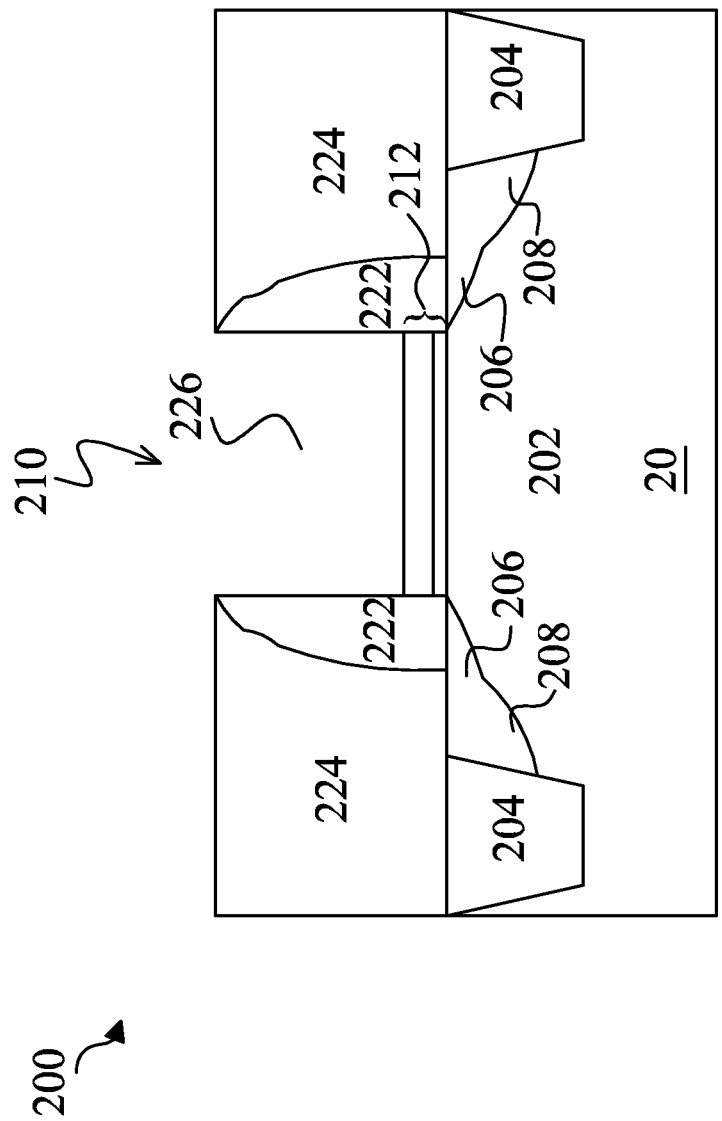
Figure 2H:
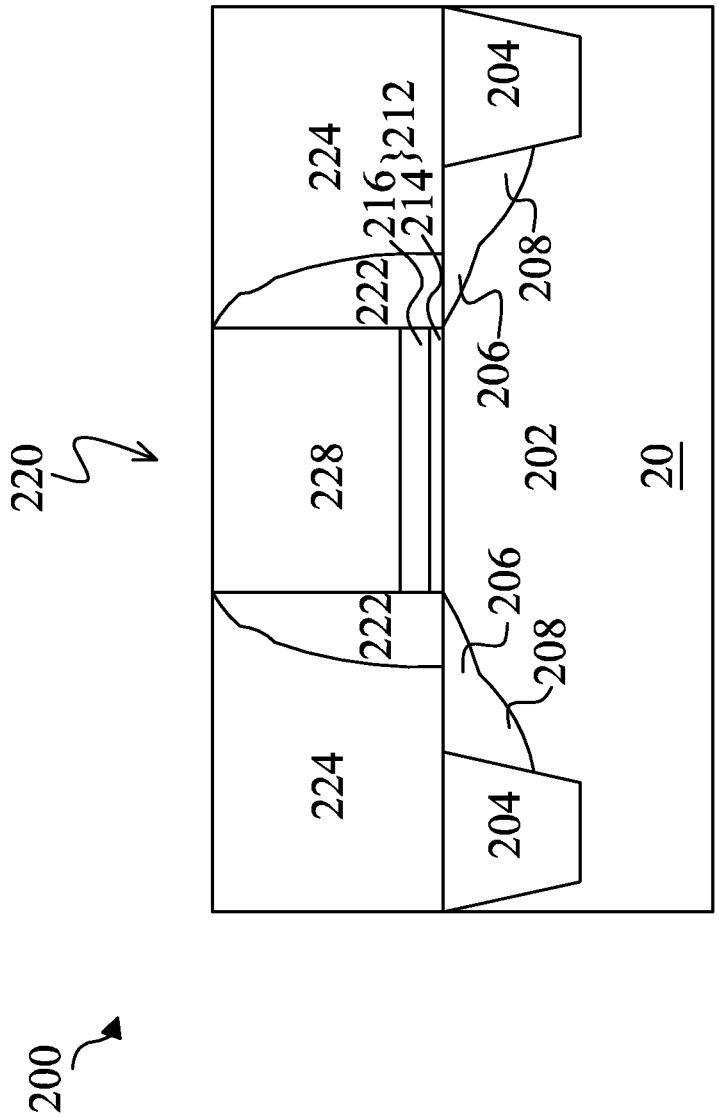

Referring to FIG. 2G, the dummy gate electrode layer 218 may be removed from the dummy gate structure 210 to form an opening 226 in the pair of gate spacers 222 by any suitable process. The dummy gate electrode layer 218 may be removed using a wet etch and/or a dry etch process. In at least one embodiment, the wet etch process for dummy poly-silicon gate electrode layer 218 includes exposure to a hydroxide solution containing ammonium hydroxide, diluted HF, deionized water, and/or other suitable etchant solutions. In other embodiments, the dry etch process for dummy poly-silicon gate electrode layer 218 may be performed under a source power of about 650 to 800 W, a bias power of about 100 to 120 W, and a pressure of about 60 to 200 mTorr, using $Cl_2$, HBr and He as etching gases.

Referring to FIG. 2H, a metal gate electrode layer 228 may be formed to completely fill the opening 226. In some embodiments, the metal gate electrode layer 228 comprises a material selected from a group of Al, Cu, Ru, Ag, TiAl, TiAlN, TiN, TiCN, TaN, TaCN, WN and WCN. The metal gate electrode layer 228 may be formed by CVD, PVD, plating, spin-on, ALD, or other suitable technique. And then, a CMP process may be performed to planarize the metal gate electrode layer 228. The CMP process may remove a portion of the metal gate electrode layer 228 until the top surface of the ILD layer 224 is reached.

In the present embodiment, the metal gate electrode layer 228 and high-k gate dielectric layer 212 are combined and referred as a gate structure 220. In other words, the gate structure 220 disposed over the substrate 20 comprises a dielectric portion (i.e., the high-k gate dielectric layer 212) and an electrode portion (i.e., the metal gate electrode layer 228) that is disposed over the dielectric portion 212, wherein the dielectric portion 212 comprises a carbon-doped high-k dielectric layer 214 on the substrate 20 and a carbon-free high-k dielectric layer 216 adjacent to the electrode portion 228.

Then, subsequent processes, including interconnect processing, are performed after forming the metal gate electrode layer 228 of the gate structure 220 to complete the semiconductor device 200 fabrication.

One aspect of this description relates to a semiconductor device including a substrate and a gate structure over the substrate. The gate structure includes a dielectric portion and an electrode portion that is disposed over the dielectric portion. The dielectric portion includes a carbon-doped high dielectric constant (high-k) dielectric layer over the substrate and a carbon-free high-k dielectric layer adjacent to the electrode portion.

Another aspect of this description relates to a semiconductor device including a substrate, and a carbon-doped high dielectric constant (high-k) dielectric layer over the substrate, wherein the carbon-doped high-k dielectric layer comprises multiple atomic layers. The semiconductor device includes a carbon-free high-k dielectric layer over the carbon-doped high k dielectric layer, wherein the carbon-free high-k dielectric layer comprises multiple atomic layers. The semiconductor device further includes a gate electrode over the carbon-free high-k dielectric layer.

Still another aspect of this description relates to a transistor device including a carbon-containing dielectric layer over a substrate. The transistor device further includes a carbon-free dielectric layer over the carbon-containing dielectric layer. The transistor device further includes a gate electrode over the carbon-free dielectric layer.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor device comprising:
a substrate; and
a gate structure over the substrate,
wherein the gate structure comprises a dielectric portion and an electrode portion that is disposed over the dielectric portion,
wherein the dielectric portion comprises a carbon-doped high dielectric constant (high-k) dielectric layer over the substrate and a carbon-free high-k dielectric layer adjacent to the electrode portion.

2. The semiconductor device of claim 1, wherein a thickness of the carbon-doped high-k dielectric layer ranges from about 3.5 angstroms to about 10 angstroms.

3. The semiconductor device of claim 1, wherein a carbon concentration of the carbon-doped high-k dielectric layer ranges from about 0.3 to about 3 atomic percent.

4. The semiconductor device of claim 1, wherein the carbon-doped high-k dielectric layer is selected from the group consisting of carbon-doped oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu and mixtures thereof.

5. The semiconductor device of claim 1, wherein the carbon-doped high-k dielectric layer comprises carbon-doped hafnium oxide.

6. The semiconductor device of claim 1, wherein a thickness of the carbon-free high-k dielectric layer ranges from about 10 angstroms to about 40 angstroms.

7. The semiconductor device of claim 1, the carbon-free high-k dielectric layer is selected from the group consisting of oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu and mixtures thereof.

8. The semiconductor device of claim 1, wherein the carbon-free high-k dielectric layer comprises hafnium oxide.

9. The semiconductor device of claim 1, wherein a ratio of a thickness of the carbon-free high-k dielectric layer to a thickness of the carbon-doped high-k dielectric layer ranges from about 1 to about 10.

10. A semiconductor device comprising:
a substrate;
a carbon-doped high dielectric constant (high-k) dielectric layer over the substrate, wherein the carbon-doped high-k dielectric layer comprises multiple atomic layers;
a carbon-free high-k dielectric layer over the carbon-doped high k dielectric layer, wherein the carbon-free high-k dielectric layer comprises multiple atomic layers; and
a gate electrode over the carbon-free high-k dielectric layer.

11. The semiconductor device of claim 10, wherein the gate electrode is in direct contact with the carbon-free high-k dielectric layer.

12. The semiconductor device of claim 10, wherein the carbon-doped high-k dielectric layer is in direct contact with the substrate.

13. The semiconductor device of claim 10, wherein the carbon-doped high-k dielectric layer has a thickness greater than about 3.5 angstroms.

14. The semiconductor device of claim 10, wherein the gate electrode is a dummy gate electrode.

15. The semiconductor device of claim 10, wherein the gate electrode comprises a material selected from the group consisting of Al, Cu, Ru, Ag, TiAl, TiAlN, TiN, TiCN, TaN, TaCN, WN and WCN.

16. The semiconductor device of claim 10, further comprising gate spaces along sidewalls of the gate electrode, the carbon-free high-k dielectric layer and the carbon-doped high-k dielectric layer.

17. A transistor device comprising:
a carbon-containing dielectric layer over a substrate;
a carbon-free dielectric layer over the carbon-containing dielectric layer; and
a gate electrode over the carbon-free dielectric layer; wherein the carbon-containing dielectric layer is in direct contact with the substrate.

18. The transistor device of claim 17, wherein a carbon concentration of the carbon-containing dielectric layer ranges from about 0.3 to about 3 atomic percent.

19. The transistor device of claim 17, wherein the transistor device is an n-type metal-oxide-semiconductor (NMOS) transistor device or a p-type metal-oxide-semiconductor (PMOS) transistor device.

\* \* \* \* \*